United States Patent [19]
Sato et al.

[11] Patent Number: 6,026,832
[45] Date of Patent: Feb. 22, 2000

[54] ULTRASONIC CLEANING APPARATUS

[75] Inventors: Nobuaki Sato; Mitsuhiro Nishizaki, both of Kanagawa, Japan

[73] Assignee: Sony Corporation, Tokyo, Japan

[21] Appl. No.: 09/084,170

[22] Filed: May 26, 1998

[30]     Foreign Application Priority Data

May 26, 1997 [JP] Japan ................................. 9-134671

[51] Int. Cl.[7] ............................................. B08B 3/00
[52] U.S. Cl. ............................. 134/184; 134/902; 134/1
[58] Field of Search .......................... 134/184, 186, 134/1, 902, 1.3

[56]              References Cited

U.S. PATENT DOCUMENTS

| | | | |
|---|---|---|---|
| 4,543,130 | 9/1985 | Shwartzman | 134/1 |
| 4,858,875 | 8/1989 | Nielsen | 248/488 |
| 4,902,350 | 2/1990 | Steck | 134/1 |
| 5,113,881 | 5/1992 | Lin et al. | 134/1 |
| 5,133,376 | 7/1992 | Samarin et al. | 134/184 |
| 5,379,785 | 1/1995 | Ohmori et al. | 134/184 |
| 5,672,212 | 9/1997 | Manos | 134/1.3 |

*Primary Examiner*—Randy Gulakowski
*Assistant Examiner*—Paul J. Lee
*Attorney, Agent, or Firm*—Hill & Simpson

[57]              ABSTRACT

The invention provides an ultrasonic cleaning apparatus capable of radiating ultrasonic waves effectively over the entire cleaning face of a wafer and thus having an improved cleaning effect. Supporting members 28a, 28b for holding wafers 7 in a fixed attitude in a cleaning liquid 6 are disposed at different heights, and ultrasonic wave protection plates 24a, 24b are respectively provided in front of ultrasonic wave generators 23a, 23b mounted on opposite walls of an ultrasonic wave tank 2 and are each movable between a position in front of the respective ultrasonic wave generator and a standby position retracted from in front of that ultrasonic wave generator. Each of the ultrasonic wave protection plates 24a, 24b is moved into position in front of its respective ultrasonic wave generator when ultrasonic waves are being radiated from the other side. The ultrasonic wave generators 23a, 23b are operated alternately, and an ultrasonic wave shadow region 29a (29b) in the shadow of a supporting member 28a (28b) when ultrasonic waves are being radiated from one side is subsequently irradiated with ultrasonic waves from the other side so that ultrasonic waves are radiated over the entire area of the cleaning face 7a of each wafer 7.

6 Claims, 7 Drawing Sheets

ULTRASONIC CLEANING APPARATUS

BACKGROUND OF THE INVENTION

This invention relates to an ultrasonic cleaning apparatus, and particularly to an ultrasonic cleaning apparatus ideal for use in a semiconductor wafer cleaning process.

Ultrasonic cleaning is used as a most powerful physical cleaning method for the surface cleaning of various members and components. In particular, when ultrasonic cleaning is used for a wafer surface cleaning step in a semiconductor manufacturing process, whereas cavities readily forming at frequencies of 20 kHz to 50 kHz were used in the past, along with the microminiaturization of interconnection patterns damage to patterns caused by strong cavities came to be seen as a problem, and at present megasonic frequencies of 800 kHz to 1000 kHz with which it is possible to remove minute particles by means of acceleration of vibration without damaging patterns are being widely used. The cleaning effect of ultrasonic cleaning is raised when it is used together with chemical cleaning using for example an acid or an alkali.

FIG. 1 shows an ultrasonic cleaning apparatus of the related art. In this ultrasonic cleaning apparatus 1, a semiconductor wafer 7 (hereinafter called simply a wafer) constituting a thin plate member to be cleaned is immersed in a cleaning tank 5 filled with a cleaning liquid 6, and ultrasonic waves are radiated over the wafer 7 from an ultrasonic wave generator 3 mounted on one side wall of an ultrasonic wave tank 2 outside the cleaning tank 5. Cooling water 4 is passed through the ultrasonic wave tank 2 to prevent heating of the ultrasonic wave generator 3. The wafer 7 is held in a fixed attitude in the cleaning liquid 6 by being supported by supporting members 8a, 8b in which are formed grooves into which fits the periphery of the wafer 7. A number of such wafers 7 are held by the supporting members 8a, 8b in a stack perpendicular to the plane of the paper of FIG. 1, and the ultrasonic waves are radiated horizontally in parallel with the surfaces (cleaning faces) 7a of the wafers 7. The ultrasonic wave tank 2 and the cleaning tank 5 are both made of resin, and particularly for the cleaning tank 5 a fluorine resin having good resistance to chemicals is used.

FIG. 2 and FIG. 3 show other ultrasonic cleaning apparatuses of the related art. Parts in these figures equivalent to parts in FIG. 1 have been given the same reference numerals and will not be described in detail here. In the ultrasonic cleaning apparatus 11 shown in FIG. 2, the ultrasonic wave generator 3 is mounted on the bottom wall of the ultrasonic wave tank 2 and ultrasonic waves are radiated at the wafers 7 above from there. In the ultrasonic cleaning apparatus 12 shown in FIG. 3, multiple ultrasonic cleaning apparatuses 3a, 3b, 3c, 3d, 3e having different irradiation regions are mounted in two opposite side walls of the ultrasonic wave tank 2 and ultrasonic waves are radiated over the wafers 7 from both sides.

In these ultrasonic cleaning apparatuses 1, 11 and 12, due to the presence of the supporting members 8a, 8b holding the wafers 7 in the cleaning liquid 6, there is a shadow where ultrasonic waves, which travel highly rectilinearly, cannot reach. (This phenomenon is discussed in 'Ultrasonic Engineering', Masanori Shimakawa, Kogyo Chousa Kai (The Industrial Survey Association), 1975, pages 17 and 18.) That is, in the ultrasonic cleaning apparatuses 1 and 12 shown in FIG. 1 and FIG. 3 the supporting member 8b obstructs the advance of ultrasonic waves and creates an ultrasonic wave shadow region (shown with double hatching in the figures; similarly hereinafter) 9 in the cleaning faces of the wafers 7, and in the ultrasonic cleaning apparatus 11 shown in FIG. 2 the supporting members 8a and 8b create shadow regions 9a and 9b, and thus in all three of these cases there is the problem that the cleaning effect of the apparatus is reduced in these shadow regions. Although it is possible to reduce the sizes of these ultrasonic wave shadow regions 9, 9a and 9b by making the supporting members 8a, 8b thin and disposing them as near as possible to the lower end or the sides of the wafer 7 to solve this problem, there is clearly a limit to the improvement that can be achieved in this way.

SUMMARY OF THE INVENTION

It is therefore an object of the invention to provide an ultrasonic cleaning apparatus capable of radiating ultrasonic waves effectively over the entire cleaning face of a wafer and thereby having an improved cleaning effect.

According to one provision of the invention, supporting members for supporting the lower periphery of a thin plate member are provided in different height positions and a shadow region created by the supporting member of one side not reached by ultrasonic waves radiated from that side is cleaned by ultrasonic waves radiated from the other side. By this means it is possible to clean the entire cleaning face of the thin plate member effectively.

According to a fifth provision of the invention, an ultrasonic wave shadow region created by a supporting member of an ultrasonic wave generator side is cleaned by being irradiated with ultrasonic waves reflected through a predetermined reflection angle by an ultrasonic wave reflecting plate provided on the opposite side of the thin plate member from the ultrasonic wave generator. By this means it is possible to clean the entire cleaning face of the thin plate member effectively.

According to a still further provision of the invention, of supporting members supporting the lower periphery of a thin plate member, a supporting member positioned on the ultrasonic wave generator side of the thin plate member is made movable around the periphery of said thin plate member, and a shadow region not reached by ultrasonic waves from one side can be irradiated with ultrasonic waves by this supporting member being moved. By this means it is possible to clean the entire cleaning face of the thin plate member effectively.

According to yet another provision of the invention, supporting members for supporting in at least two places the lower periphery of a thin plate member are provided on the same horizontal line, and a shadow region between the supporting members which ultrasonic waves radiated horizontally from a first ultrasonic wave generator cannot reach is cleaned by ultrasonic waves radiated vertically from a second ultrasonic wave generator. By this means it is possible to clean the entire cleaning face of the thin plate member effectively.

DETAILED DESCRIPTION OF THE PREFERRED EMBODIMENTS

Ultrasonic cleaning apparatuses according to preferred embodiments of the invention will now be described with reference to the accompanying drawings.

Figure 1:
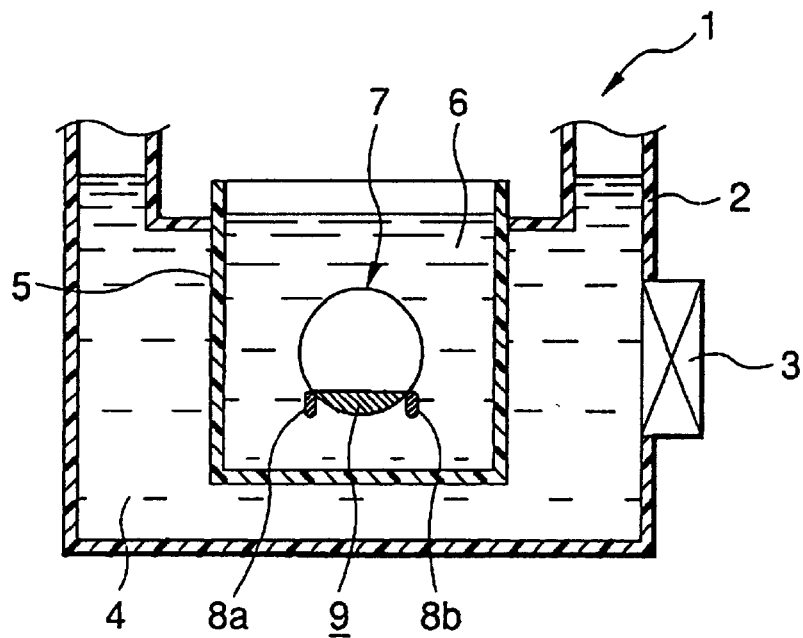
FIG. 1 is a schematic sectional view of an ultrasonic cleaning apparatus of the related art.
Figure 2:
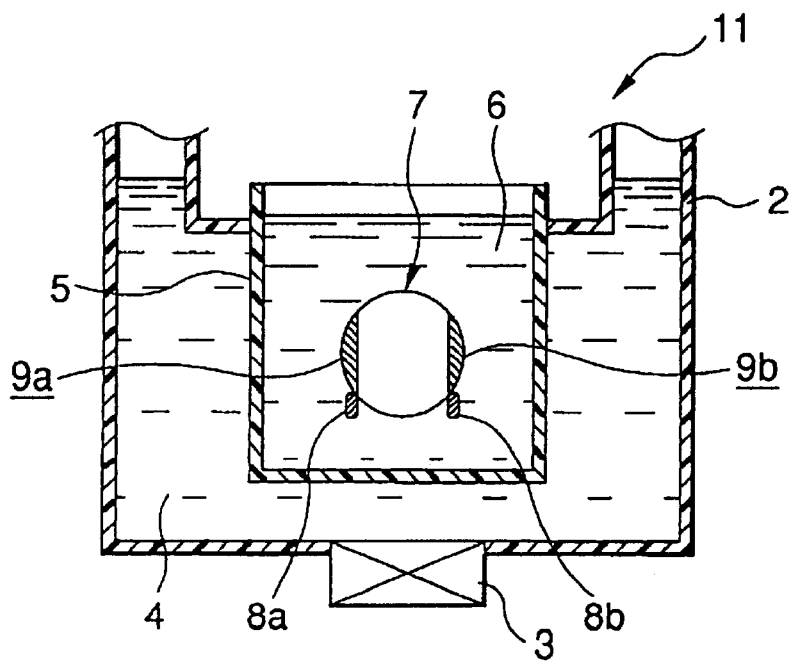
FIG. 2 is a schematic sectional view of another ultrasonic cleaning apparatus of the related art.
Figure 3:
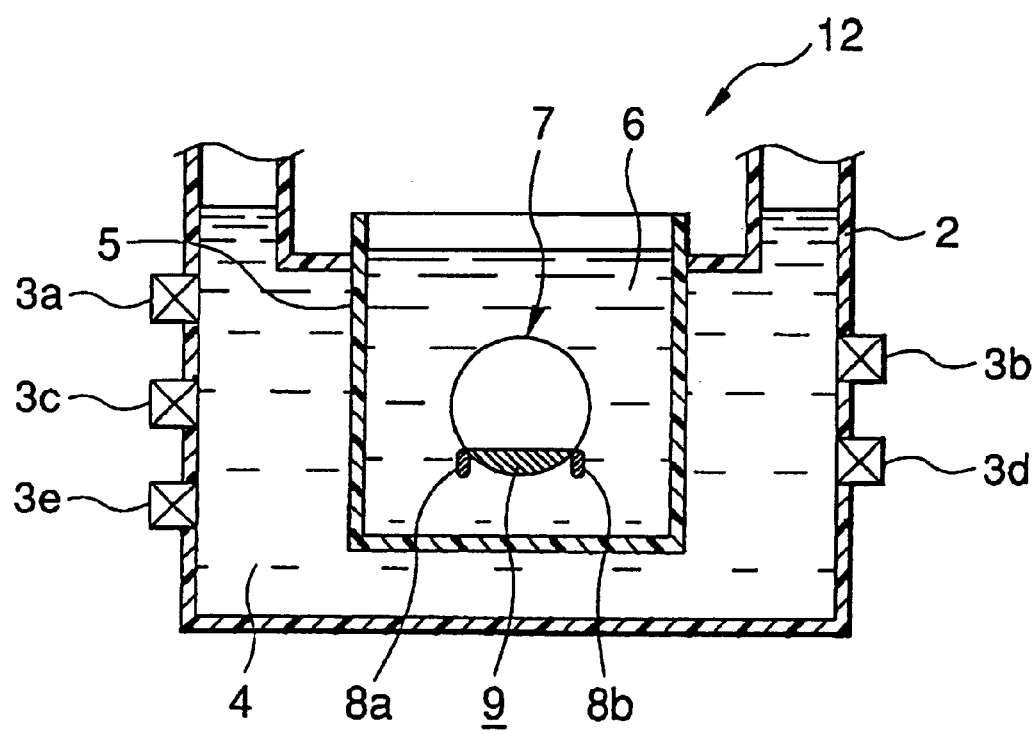
FIG. 3 is a schematic sectional view of further ultrasonic cleaning apparatus of the related art.
Figure 4:
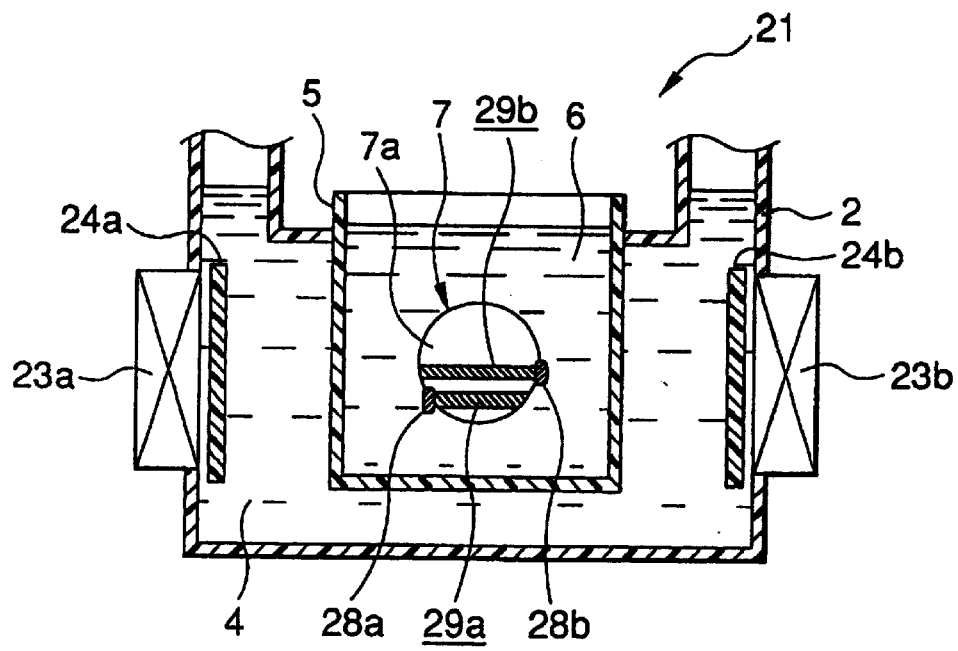
FIG. 4 is a schematic sectional view of an ultrasonic cleaning apparatus according to a first preferred embodiment of the invention.

FIG. 4 shows an ultrasonic cleaning apparatus 21 according to a first preferred embodiment of the invention. Parts equivalent to parts in the related art example shown in FIG. 1 have been given the same reference numerals as in FIG. 1 and will not be described in detail here.

In the ultrasonic cleaning apparatus 21 of this preferred embodiment, two supporting members 28a, 28b for supporting in a cleaning liquid 6 a wafer 7 constituting a thin plate member to be cleaned are each mounted at a different height position. The height difference between these supporting members 28a, 28b is set to at least the vertical direction length of each of the supporting members 28a, 28b. Ultrasonic wave generators 23a, 23b for radiating ultrasonic waves in parallel with the cleaning face 7a are mounted at the same height in opposite side walls of the ultrasonic wave tank 2 and radiate ultrasonic waves over the same region of the cleaning face 7a. Also, ultrasonic wave protection plates 24a, 24b made of a resin such as for example vinyl chloride are provided in front of the ultrasonic wave generators 23a, 23b respectively.

The ultrasonic wave protection plates 24a, 24b are movable back and forth in a direction perpendicular to the plane of the paper of FIG. 4, and, explaining the operation of these ultrasonic wave protection plates 24a, 24b taking the ultrasonic wave protection plate 24a as an example, when the ultrasonic wave generator 23a is operating the ultrasonic wave protection plate 24a is positioned in a standby position to which it is retracted from in front of the ultrasonic wave generator 23a so as not to block the propagation of ultrasonic waves from that ultrasonic wave generator, and when that ultrasonic wave generator 23a is not operating the ultrasonic wave protection plate 24a is positioned in front of the ultrasonic wave generator 23a in order to protect it from ultrasonic waves emitted from the other ultrasonic wave generator 23b. These two ultrasonic wave generators 23a, 23b never operate at the same time.

Figure 5:
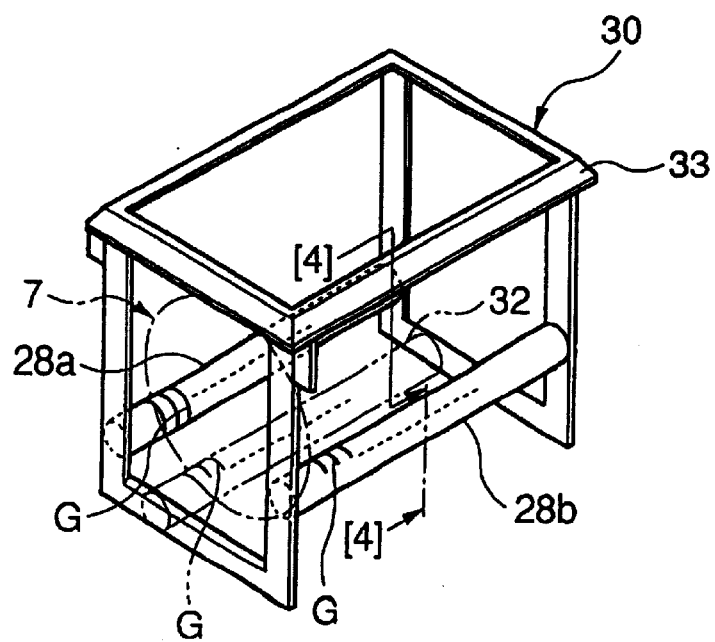
FIG. 5 is a perspective view of a thin plate member holder according to the invention.

The supporting members 28a, 28b are formed as constituent members of a wafer holder 30, shown in FIG. 5, serving as a thin plate member holder of the invention, and have grooves G formed in them where they make contact with the peripheries of wafers 7. That is, wafers 7 (one of which is shown with a single dash chain line in the figure) are supported by having their peripheries fitted in grooves in the supporting members 28a, 28b. The member 32 shown with a double dash chain line in FIG. 5 is an auxiliary member for preventing the wafers 7 from tipping over and upper ends of adjacent wafers 7 from making contact with each other due to the supporting action of the grooves G of the supporting members 28a, 28b being insufficient, and grooves G are also formed in this. This auxiliary member 32 is provided or not according to whether or not it is needed, and when it is provided it is mounted at a different height from the supporting members 28a, 28b.

Figure 6:
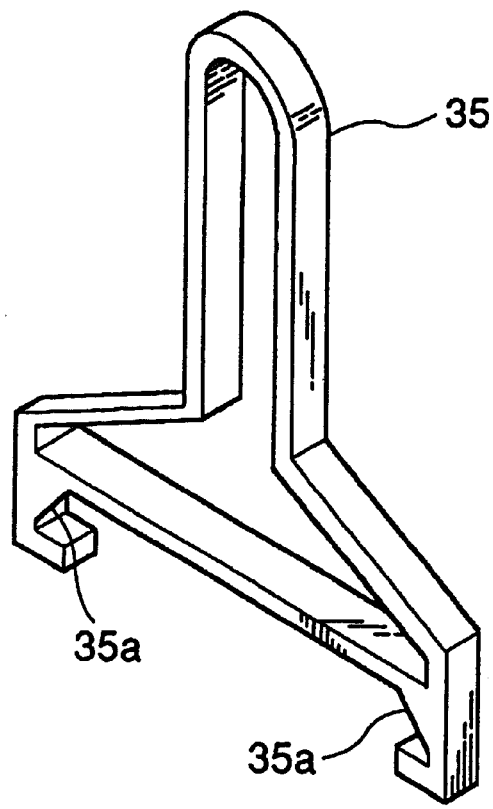
FIG. 6 is a perspective view of a handle for gripping this thin plate member holder.
Figure 7:
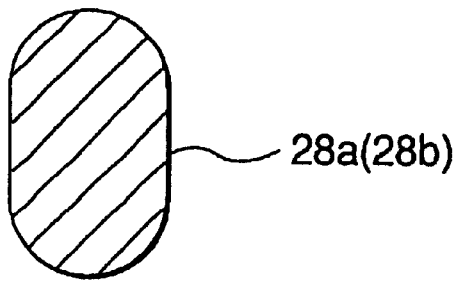
FIG. 7 is an enlarged sectional view on the line [4]—[4] in FIG. 5.

The upper part of the sectional shape of each of the supporting members 28a, 28b and the auxiliary member 32 is semi-circular, and the upper part of the sectional shape of each of the other members constituting the wafer holder 30 is tapered. By this means, cleaning liquid 6 is prevented from remaining on the wafer holder 30 when it is lifted from the cleaning tank 5. Also, an upper frame 33 of the wafer holder 30 is constructed to be gripped by engaging parts 35a, 35b of a commercially available handle 35, shown in FIG. 6, and setting of the wafer holder 30 in the cleaning tank 5 is thereby made easy.

The operation of the ultrasonic cleaning apparatus 21 of this preferred embodiment will now be described.

After the wafers 7 are set inside the cleaning tank 5, first, one of the ultrasonic wave generators, for example the ultrasonic wave generator 23a, is driven and ultrasonic waves are thereby radiated over the cleaning faces 7a of the wafers 7 from the left in the figure. At this time the ultrasonic wave protection plate 24a is positioned in its standby position and the other ultrasonic wave protection plate 24b is positioned in front of the ultrasonic wave generator 23b. The cleaning faces 7a of the wafers 7 receive ultrasonic waves radiated from the ultrasonic wave generator 23a and are cleaned, but in an ultrasonic wave shadow region 29a in the shadow of the supporting member 28a the cleaning action is insufficient.

After a predetermined time elapses, the operation of the ultrasonic wave generator 23a is stopped and the other ultrasonic wave generator 23b is operated, and ultrasonic waves are thereby radiated at the cleaning faces 7a of the wafers 7 from the right in the figure. At this time the ultrasonic wave protection plate 24a is positioned in front of the ultrasonic wave generator 23a and the other ultrasonic wave protection plate 24b has been retracted to its standby position. The cleaning faces 7a receive ultrasonic waves radiated from the ultrasonic wave generator 23b and are cleaned, including the ultrasonic wave shadow region 29a which the previous ultrasonic waves radiated from the left did not reach. At this time also there is an ultrasonic wave shadow region 29b, in the shadow of the supporting member 28b, but because this region has already been cleaned by irradiation with ultrasonic waves from the left it does not constitute any problem.

Thus, with the ultrasonic cleaning apparatus 21 of this preferred embodiment, because ultrasonic waves can be effectively radiated over the entire area of the cleaning faces 7a of the wafers 7, cleaning of the wafers 7 can be performed effectively.

Figure 8:
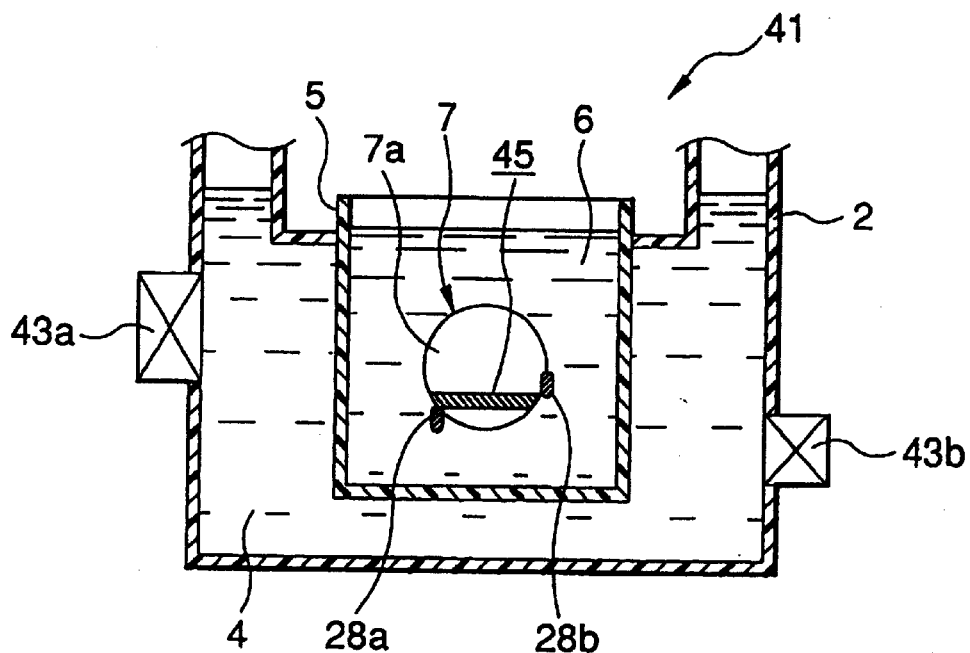
FIG. 8 is a schematic sectional view of an ultrasonic cleaning apparatus according to a second preferred embodiment of the invention.

FIG. 8 shows an ultrasonic cleaning apparatus 41 of a second preferred embodiment. Parts equivalent to parts in FIG. 4 have been given the same reference numerals as in FIG. 4 and will not be described in detail here.

In the ultrasonic cleaning apparatus 41 of this preferred embodiment, ultrasonic wave generators 43a and 43b disposed in opposite walls are each provided at a different height and ultrasonic waves are radiated at different regions of the cleaning faces 7a simultaneously. That is, in this preferred embodiment it is made possible for the two ultrasonic wave generators 43a, 43b to be operated simultaneously so that the time required to clean the wafers 7 can be shortened. In this case, depending on how the ultrasonic wave generators 43a and 43b are disposed, there may be a shadow region 45 in the cleaning face 7a that ultrasonic waves radiated from the left and right ultrasonic wave generators 43a and 43b cannot reach. To overcome this, in this preferred embodiment, at such times, a mechanism for raising and lowering the wafer holder 30 (FIG. 5) is provided, and the shadow region 45 is cleaned by ultrasonic waves radiated from one or the other of the ultrasonic wave generators 43a and 43b while the wafers 7 are moved up or down.

By means of this preferred embodiment it is possible to obtain the same effects as those of the first preferred embodiment described above and also make the time taken to clean the wafers 7 shorter than in the case of the first preferred embodiment.

Figure 9:
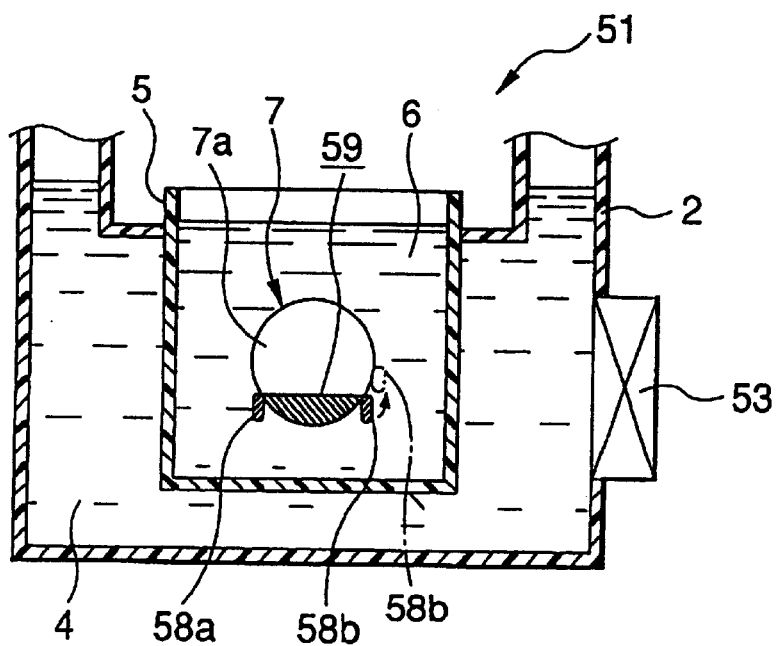
FIG. 9 is a schematic sectional view of an ultrasonic cleaning apparatus according to a third preferred embodiment of the invention.

FIG. 9 shows an ultrasonic cleaning apparatus 51 according to a third preferred embodiment of the invention. Parts equivalent to parts in FIG. 4 have been given the same reference numerals as in FIG. 4 and will not be described in detail here.

In this preferred embodiment, only one ultrasonic wave generator 53 is disposed in a side wall of the ultrasonic wave tank 2, and of the supporting members 58a, 58b for supporting the lower periphery of the wafers 7 in the cleaning liquid 6 the supporting member 58b is movable around the periphery of the wafers 7 to the position shown in FIG. 9 with a single dash chain line as shown with an arrow in the figure. As the moving mechanism, for example rails capable of guiding the ends of the supporting member 58b are formed in the wafer holder (FIG. 5) and those ends are mechanically lifted from above the cleaning tank 5. The distance through which the supporting member 58b is moved is a distance such that it can be moved up and down at least through its vertical length.

When cleaning is carried out, first, the supporting member 58b supports the wafers 7 at the same height position as the other supporting member 58a. At this time there is an ultrasonic wave shadow region 59 in the cleaning faces 7a of the wafers 7. However, by the supporting member 58b being moved to the position shown with a double dash chain line, ultrasonic waves can be radiated over this ultrasonic wave shadow region 59.

Figure 10:
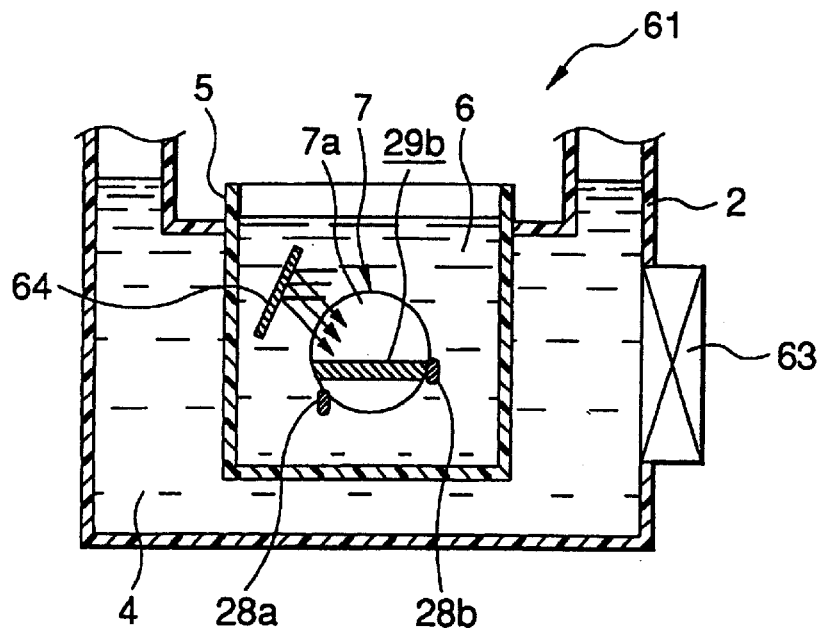
FIG. 10 is a schematic sectional view of an ultrasonic cleaning apparatus according to a fourth preferred embodiment of the invention.

FIG. 10 shows an ultrasonic cleaning apparatus 61 according to a fourth preferred embodiment of the invention. Parts the same as parts in FIG. 4 have been given the same reference numerals as in FIG. 4 and will not be described in detail here.

In this preferred embodiment, an ultrasonic wave generator 63 is provided in one side wall of the ultrasonic wave tank 2 and an ultrasonic wave reflecting plate 64 is disposed in the cleaning tank 5 on the opposite side of the wafers 7 from the ultrasonic wave generator 63. This ultrasonic wave reflecting plate 64 is mounted in a fixed position so as to reflect ultrasonic waves radiated from the ultrasonic wave generator 63 through a predetermined angle of reflection, and ultrasonic waves are radiated at the ultrasonic wave shadow region 29b via this ultrasonic wave reflecting plate 64. By means of this preferred embodiment also it is possible to effectively clean the entire area of the cleaning faces 7a of the wafers 7.

Preferably, the ultrasonic wave reflecting plate has a large plate thickness and is made of a material having a greatly different acoustic impedance from that of the cleaning liquid 6. Also, it is possible to obtain the same effects even if the supporting members 28a, 28b are mounted in the same height position.

Figure 11:
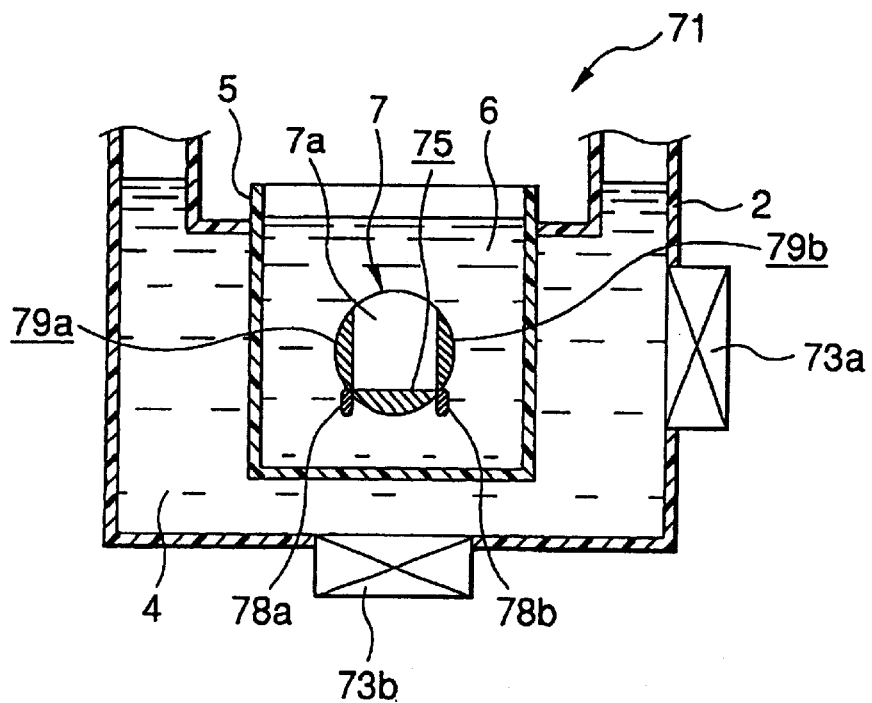
FIG. 11 is a schematic sectional view of an ultrasonic cleaning apparatus according to a fifth preferred embodiment of the invention.

FIG. 11 shows an ultrasonic cleaning apparatus according to a fifth preferred embodiment of the invention. Parts the same as parts in FIG. 4 have been given the same reference numerals as in FIG. 4 and will not be described in detail here.

In this preferred embodiment, a first ultrasonic wave generator 73a is disposed in one side wall of the ultrasonic wave tank 2 and a second ultrasonic wave generator 73b is disposed in the bottom wall of the ultrasonic wave tank 2, and supporting members 78a, 78b for supporting the peripheries of wafers 7 are provided on the same horizontal line, i.e. at the same height position. That is, an ultrasonic wave shadow region 75 of when ultrasonic waves are radiated from the first ultrasonic wave generator 73a is cleaned by ultrasonic waves radiated from the second ultrasonic wave generator 73b, and ultrasonic wave shadow regions 79a, 79b of when ultrasonic waves are radiated from the second ultrasonic wave generator 73b are cleaned by ultrasonic waves radiated from the first ultrasonic wave generator 73a. By this means it is possible to obtain the same effects as those of the preferred embodiments described above.

Although several specific preferred embodiments of the invention have been described above, the invention is of course not limited to these, and various changes and modifications are possible on the basis of the technological scope of the invention.

For example, in the first preferred embodiment, ultrasonic wave protection plates 24a, 24b are provided in front of the ultrasonic wave generators 23a, 23b respectively and the ultrasonic wave protection plates 24a, 24b are moved according to whether or not the respective ultrasonic wave generator is operating, but instead of this the ultrasonic wave protection plates 24a, 24b may be dispensed with and the ultrasonic wave generators 23a, 23b themselves moved.

And although in the fourth preferred embodiment the ultrasonic wave reflecting plate 64 was fixed at a predetermined angle of inclination, when the ultrasonic wave shadow region 29b is large in area, the ultrasonic wave reflecting plate 64 may be made to oscillate and the angle through which it reflects ultrasonic waves thereby changed during cleaning. Also, the ultrasonic wave reflecting plate 64 may alternatively be disposed in the ultrasonic wave tank 2 outside the cleaning tank 5 (in the cooling water 4).

Figure 12:
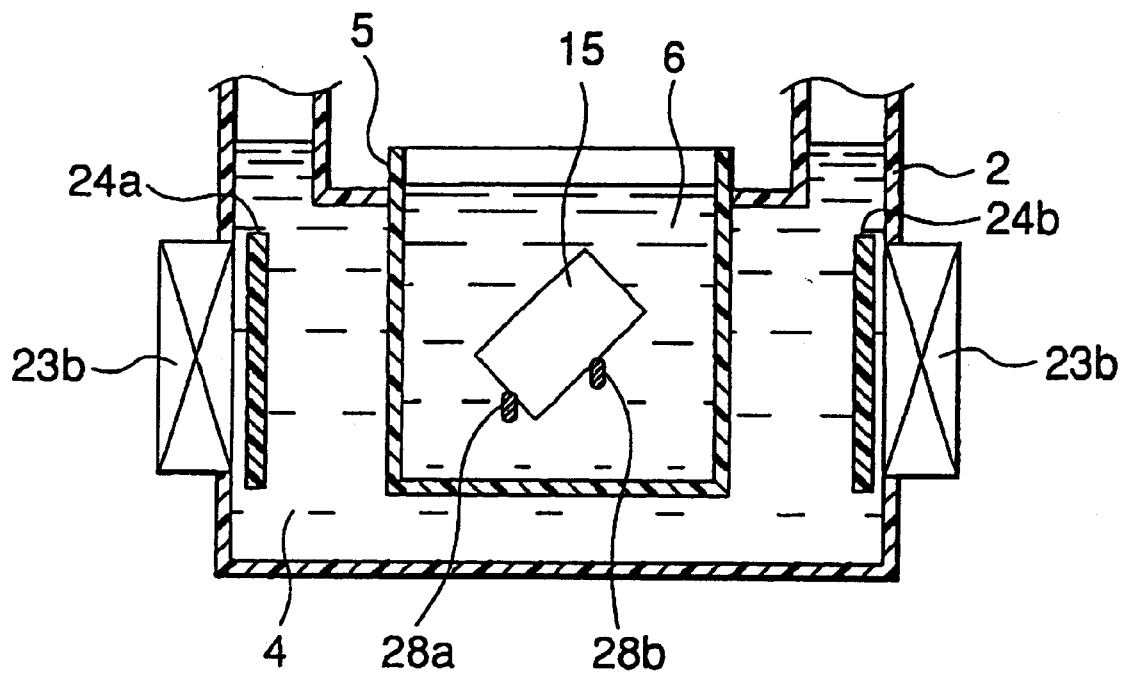
FIG. 12 is a schematic sectional view of another version of the first preferred embodiment.

And although in all the preferred embodiments described above a semiconductor wafer 7 is used as an example of a thin plate member, the invention is not limited to this and can also be applied to other thin plate-shaped members requiring cleaning, such as for example circuit boards. In this case unlike a wafer the surface shape of the board is generally rectangular, but for example the thin plate member 15 can be held in the cleaning liquid 6 as shown in FIG. 12. FIG. 12 shows an apparatus according to the first preferred embodiment described above, and parts equivalent to parts in FIG. 4 have been given the same reference numerals as those used in FIG. 4.

Figure 13:
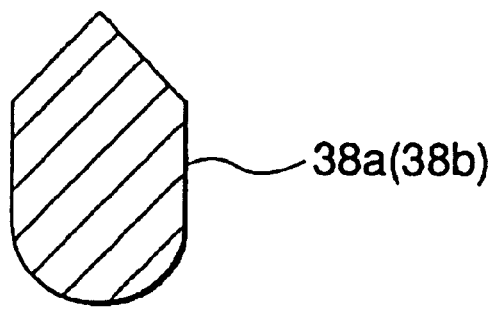
FIG. 13 is a sectional view corresponding to FIG. 7 of another version of the thin plate member holder.

Also, the supporting members 28a, 28b, . . . may be made supporting members 38a, 38b having tapered sectional upper parts of the kind shown in FIG. 13. By this means it is possible to prevent cleaning liquid from remaining on the wafer holder 30 when it is lifted from the cleaning tank 5.

Also, although in all the preferred embodiments described above the ultrasonic wave generators 23a, 23b . . . are provided on the ultrasonic wave tank 2 and thereby protected from the cleaning liquid, depending on the type of the cleaning liquid (and if for example it is water) the ultrasonic wave generators may alternatively be mounted on the cleaning tank.

What is claimed is:

1. An ultrasonic cleaning apparatus comprising:
   a cleaning tank filled with a cleaning liquid;
   a thin plate member holder for holding a thin plate in said cleaning liquid, said holder having groove supporting members for supporting in at least two places the lower periphery of the thin plate member, said supporting members being provided at different height positions; and
   ultrasonic wave generating means for radiating ultrasonic waves parallel with a cleaning face of said plate member, said generating means comprising a generator on two opposite sides of the plate member holder, each generator being provided with an ultrasonic protection plate movable between a position in front of the generator and a retracted position so that when the generator is operating, the plate is in a retracted position and when the generator is not operating, the plate is in front of the generator.

2. An ultrasonic cleaning apparatus according to claim 1, wherein the upper part of each member forming said thin plate member holder tapered in cross-section.

3. An ultrasonic cleaning apparatus according to claim 1, wherein an upper part of each member forming said thin plate member holder is semi-circular in cross-section.

4. An ultrasonic cleaning apparatus according to claim 1, wherein said means comprises the supporting members being provided at different height positions, and said generators being on two opposite sides of the plate member.

5. An ultrasonic cleaning apparatus according to claim 4, wherein said generators are offset relative to one another, and said means further includes means for shifting the plate member holder in said cleaning liquid.

6. An ultrasonic cleaning apparatus according to claim 4, wherein the upper part of each member forming said thin plate member holder is tapered in cross-section.

\* \* \* \* \*